US009153335B2

(12) United States Patent
Murakami et al.

(10) Patent No.: US 9,153,335 B2
(45) Date of Patent: Oct. 6, 2015

(54) CLAMP VOLTAGE GENERATOR OF A SEMICONDUCTOR MEMORY APPARATUS

(71) Applicant: Winbond Electronics Corp., Taichung (TW)

(72) Inventors: Hiroki Murakami, Saitama (JP); Kenichi Arakawa, Chiba (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/301,344

(22) Filed: Jun. 11, 2014

(65) Prior Publication Data

US 2015/0055418 A1 Feb. 26, 2015

(30) Foreign Application Priority Data

Aug. 20, 2013 (JP) ................................. 2013-170147

(51) Int. Cl.
*G11C 16/30* (2006.01)
*G11C 16/24* (2006.01)
*G11C 16/28* (2006.01)

(52) U.S. Cl.
CPC ............... *G11C 16/24* (2013.01); *G11C 16/28* (2013.01); *G11C 16/30* (2013.01)

(58) Field of Classification Search
USPC ........................... 365/185.21, 185.18, 189.09
See application file for complete search history.

(56) References Cited

U.S. PATENT DOCUMENTS

| 7,453,742 B2* | 11/2008 | Maejima et al. ......... 365/189.09 |
| 7,595,684 B2* | 9/2009 | Maejima ....................... 327/538 |

FOREIGN PATENT DOCUMENTS

| JP | 2007-164891 | 6/2007 |
| JP | 2007164891 | 6/2007 |
| JP | 2011508354 | 3/2011 |
| JP | 2011-181157 | 9/2011 |
| JP | 2011181157 | 9/2011 |
| JP | 2011222090 | 11/2011 |

OTHER PUBLICATIONS

"Office Action of Japan Counterpart Application", issued on May 27, 2014, with English translation thereof, p. 1-p. 4.

* cited by examiner

*Primary Examiner* — Shawki S Ismail
*Assistant Examiner* — Muhammad S Islam
(74) *Attorney, Agent, or Firm* — Jianq Chyun IP Office (57) ABSTRACT

The invention provides a clamp voltage generating circuit capable of generating a correct clamp voltage. The clamp voltage generating circuit includes an emulate transistor, having a drain coupled to a power source VDD, a source coupled to a node, and a gate coupled to the clamp voltage; a current setting circuit, connected between the node and ground, for setting a current flowing from the node to the ground; a regulator, inputting a feedback voltage from the node and a reference voltage, and outputting a voltage VCLMP. The current setting circuit duplicates a current of a bit line, so that the emulate transistor is similar to a charge transfer transistor.

15 Claims, 9 Drawing Sheets

| | Erase | Write | Readout |
|---|---|---|---|
| Selected W/L | 0 | 15~20V | 0 |
| Non-selected W/L | F | 10V | 4.5 |
| SGD | F | Vcc | 4.5 |
| SGS | F | 0 | 4.5 |
| SL | F | Vcc | 0 |
| P-well | 21 | 0 | 0 |

CLAMP VOLTAGE GENERATOR OF A SEMICONDUCTOR MEMORY APPARATUS

CROSS-REFERENCE TO RELATED APPLICATION

This application claims the priority benefit of Japan application serial no. 2013-170147, filed on Aug. 20, 2013. The entirety of the above-mentioned patent application is hereby incorporated by reference herein and made a part of this specification.

BACKGROUND

1. Technical Field

The invention relates to a voltage generating circuit of a semiconductor memory apparatus such as a NAND type flash memory, etc. Particularly, the invention relates to a voltage generating circuit for generating voltages, which are used for such as a bit line clamp voltage, etc.

2. Related Art

In a read operation of a flash memory, after a bit line is pre-charged, the bit line is separated from a sense amplifier to produce a potential corresponding to a data state of a memory cell on the bit line, and the sense amplifier is used to detect the potential of the bit line. A charge transfer transistor is connected between the bit line and the sense amplifier for controlling pre-charge of the bit line and charge transfer of the bit line. The operation of the charge transfer transistor is controlled by a clamp voltage generated by a clamp voltage generating circuit.

Generally, in order to determine data as "0" or "1", the clamp voltage generating circuit has to generate a clamp voltage with a low level. Therefore, a conventional clamp voltage generating circuit is composed of intrinsic transistors with a low threshold value, though such type of transistors has a shortage of uneven threshold values. In order to avoid such problem, a patent document 1 discloses a clamp voltage generating circuit, in which a resistor voltage divider circuit is disposed between an input section of a current mirror circuit and a ground potential, and a potential setting circuit is disposed between an output of the resistor voltage divider circuit and an output section of the current mirror circuit, so that the clamp voltage is generated at the output section of the current mirror circuit.

Figure 1:
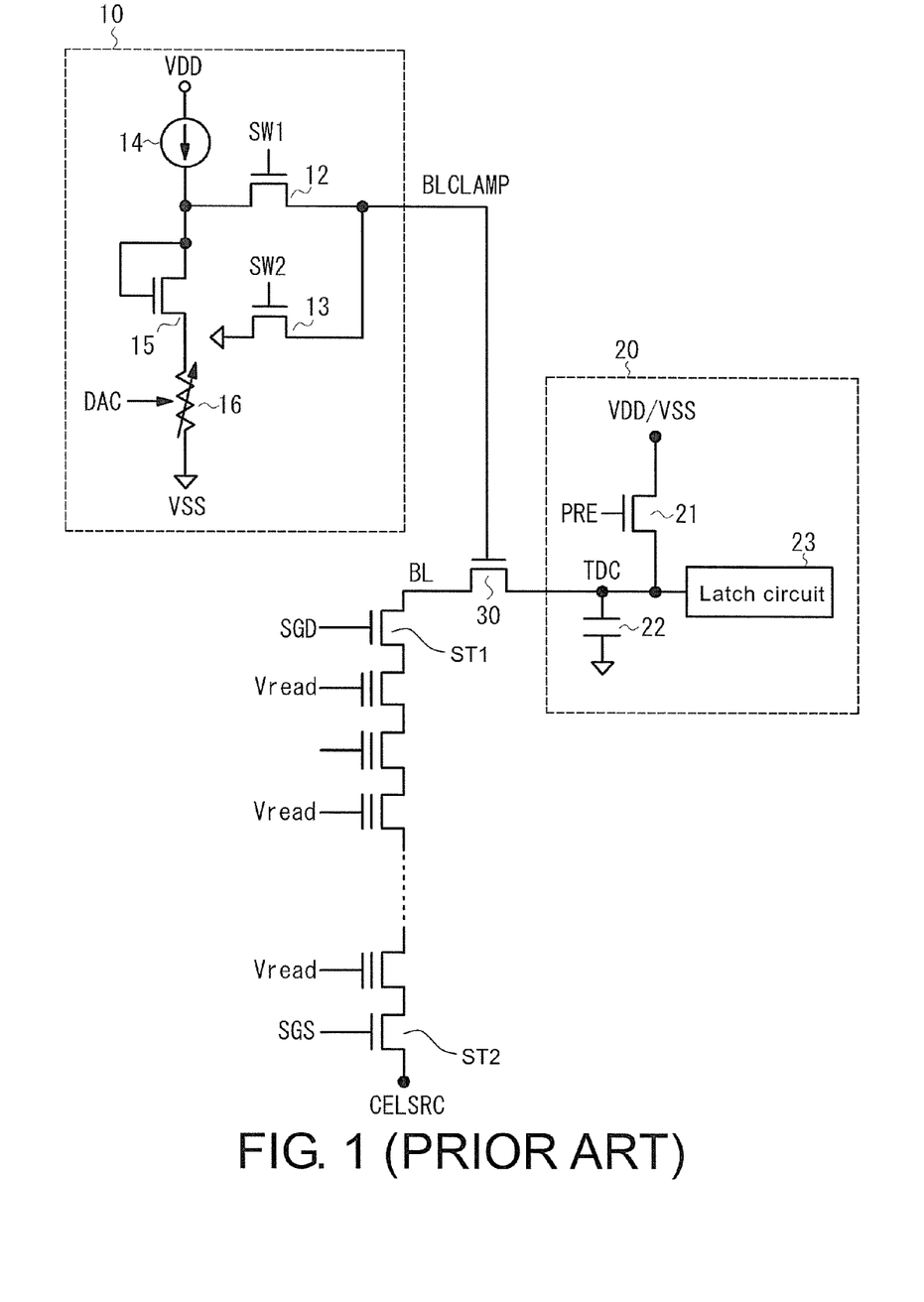
FIG. 1 is a diagram of a conventional clamp voltage generating circuit of a flash memory.

Moreover, in order to prevent wrong sensing of data stored in the memory unit, a patent document 2 discloses a clamp voltage generating circuit shown in FIG. 1. As shown in FIG. 1, one end of a charge transfer transistor 30 is connected to a bit line BL, and another end thereof is connected to a sense amplifier 20. A gate of the charge transfer transistor 30 is connected to the clamp voltage generating circuit 10. The clamp voltage generating circuit 10 includes a constant current source 14, N-channel metal oxide semiconductor (NMOS) transistors 12 and 13 serving as switch devices, an NMOS transistor 15 having a same threshold voltage with that of the charge transfer transistor 30, and a variable resistor 16.

The sense amplifier 20 includes an NMOS transistor 21, a capacitor 22 and a latch circuit 23. A drain of the NMOS transistor 21 is coupled to a power node VDD/VSS, a source thereof is connected to a sensing node TDC, and the NMOS transistor 21 sets the sensing node TDC to one of a power voltage VDD and a ground voltage VSS.

In the read operation, the bit line BL is charged to a precharge voltage VPRE by the clamp voltage generating circuit 10. To be specific, the transistor 12 is turned on, and the transistor 13 is turned off. A resistance value of the variable resistor 16 is set according to a manner that a voltage drop of the variable resistor 16 reaches the precharge voltage VPRE. In this way, a voltage of "VPRE+Vth" is applied to the gate of the charge transfer transistor 30 to serve as a bit line clamp voltage BLCLAMP. Now, the sensing node TDC is charged to the power voltage VDD. The charge transfer transistor 30 is turned off at a time point when the bit line BL reaches the precharge voltage VPRE.

Then, the transistor 12 is turned off, and the transistor 13 is turned on, and 0V is applied to the gate of the charge transfer transistor 30 to serve as the clamp voltage BLCLAMP, and the charge transfer transistor 30 is turned off, and the bit line BL is in a floating state. Then, a read voltage is applied to a selected word line, and a read pass voltage is applied to the non-selected word lines, and a selection transistor ST1 and a selection transistor ST2 are turned on, and a source line CELSRC, for example, has a level of 0V.

Then, the clamp voltage generating circuit 10 generates a voltage "Vsen+Vth" to serve as the clamp voltage BLCLAMP, which is implemented by setting the voltage drop of the variable resistor 16 to the sensing voltage Vsen. When the selected memory unit is turned on, the bit line BL is discharged, and the voltage of the bit line BL is below the sensing voltage Vsen, and the charge transfer transistor 30 is turned on. When the charge transfer transistor 30 is turned on, the sensing node TDC charged to the power voltage VDD discharges. The sense amplifier 20 determines the stored data of the selected memory unit to be "1", and maintains the determination result in the latch circuit 23.

TECHNICAL DOCUMENT OF RELATED ART

Patent document 1: Japan Patent Laid open No. 2007-164891

Patent document 2: Japan Patent Laid open No. 2011-181157

Figure 2:
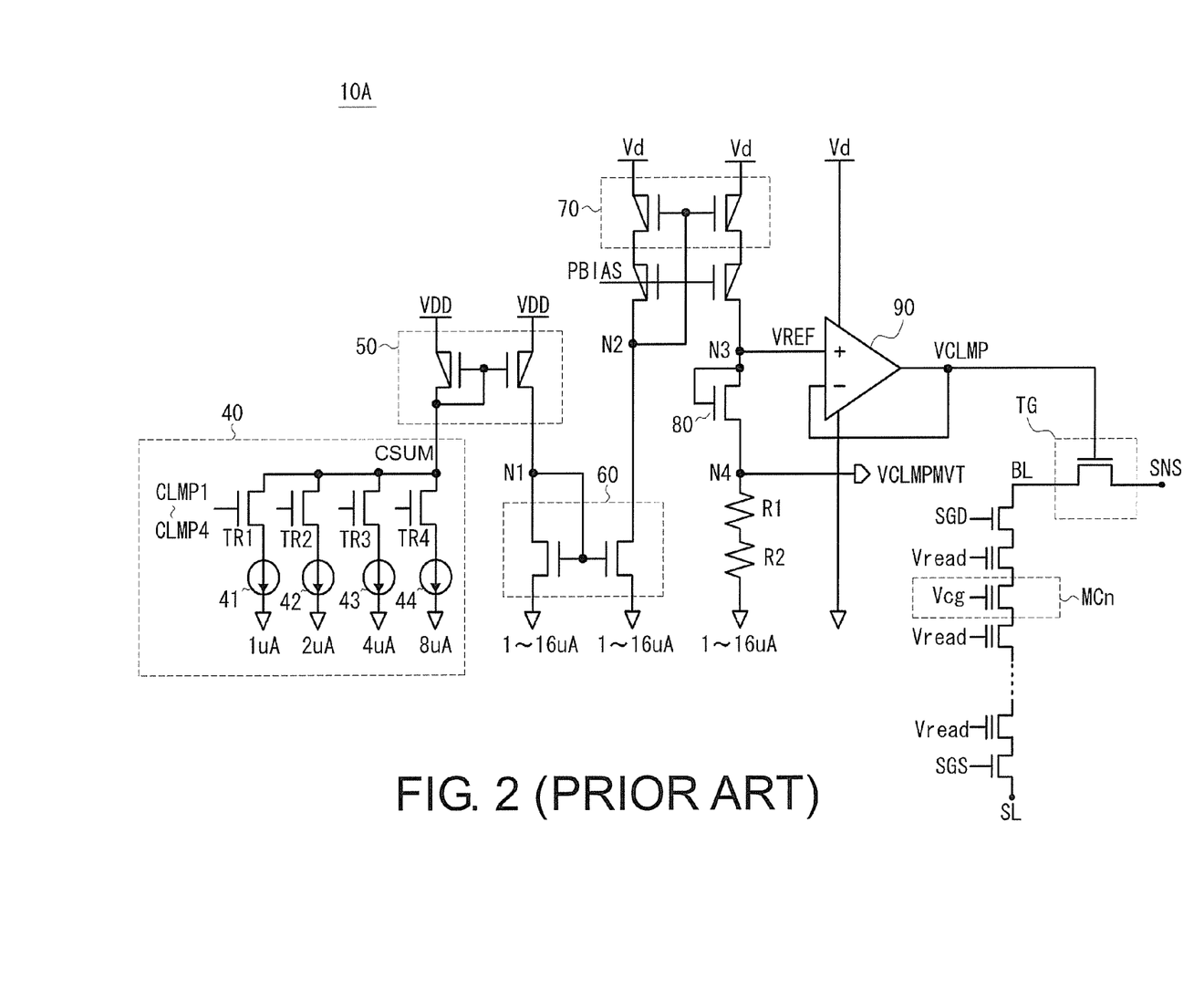
FIG. 2 is a diagram of a conventional clamp voltage generating circuit of a flash memory.

FIG. 2 is a diagram of another conventional clamp voltage generating circuit. The clamp voltage generating circuit 10A is formed in a peripheral circuit region of a flash memory, and includes a current setting circuit 40, current mirror circuits 50, 60 and 70, a transistor 80 emulating the charge transfer transistor, and a rail-to-rail amplifier 90, etc.

The current setting circuit 40 has a plurality of NMOS transistors connected in parallel (four transistors TR1-TR4 are shown in FIG. 2), and a plurality of constant current sources 41-44 respectively connected in series to the transistors TR1-TR4. Each of the transistors TR1-TR4 is turned on/off under control of clamp control signals CLMP1-CLMP4 respectively input to gates of the transistors TR1-TR4. Moreover, the constant current sources 41-44, for example, respectively provide constant currents of 1 μA, 2 μA, 4 μA and 8 μA. Based on 16 combinations of the clamp control signals CLMP1-CLMP4, 16 kinds of currents from 1 μA to 16 μA with a step of 1 μA can be generated at a node CSUM.

The current mirror circuit 50 includes a pair of P-channel metal oxide semiconductor (PMOS) transistors connected to a power source VDD (for example, 2.4V), where a common gate of the pair of PMOS transistors is connected to the node CSUM of the current setting circuit 40. In this way, a current flowing through a node N1 of the current minor circuit 50 is the same to the current flowing through the node CSUM, such that the currents from 1 μA to 16 μA with a step of 1 μA can flow through the node N1.

The current minor circuit 60 includes a pair of NMOS transistors connected to ground, where a common gate of the pair of NMOS transistors is connected to the node N1. In this way, a current the same as the current flowing through the node N1 is generated at the node N2 of the current mirror circuit 60, such that the currents from 1 μA to 16 μA with a step of 1 μA can flow through the node N2.

The current mirror circuit 70 includes a pair of PMOS transistors connected to a power source Vd (for example, 6V), where a common gate of the pair of PMOS transistors is connected to the node N2. Moreover, another pair of PMOS transistors are connected in series with the above pair of PMOS transistors, and a bias signal PBIAS is applied to the gates thereof. When the clamp voltage generating circuit 10A operates, the bias signal PBIAS has a low level to turn on the PMOS transistors. In this way, a current the same to the current flowing through the node N2 is generated at the node N3 of the current mirror circuit 70, such that the currents from 1 μA to 16 μA with a step of 1 μA can flow through the node N3.

An NMOS transistor 80 for emulating a charge transfer transistor TG and resistors R1 and R2 are connected in series to the node N3 at an output section of the current mirror circuit 70. The transistor 80 has a diode connection with a gate thereof connected to a drain thereof, and a threshold voltage Vth of the transistor 80, i.e. a voltage drop is equal to the threshold voltage of the charge transfer transistor TG. By suitably selecting values of the power supply Vd, and the resistors R1 and R2, voltages from 0.1V to 1.6V with a step of 0.1V are generated at the node N4 corresponding to the current values of the node CSUM. For example, when the current setting circuit 20 sets the current of 0.8 μA, a voltage of 0.8V is generated, and when the current of 1.2 μA is set, a voltage of 1.2V is generated. Therefore, a reference voltage VREF from 0.1V+Vth to 1.6V+Vth with a step of 0.1V that is added by the threshold voltage Vth can be generated at the node N3.

The voltage of the node N3 is input to a non-inverted input terminal of the rail-to-rail amplifier 90 to serve as a reference voltage VREF, and an output of the rail-to-rail amplifier 90 is negatively fed back to an inverted input terminal of the rail-to-rail amplifier 90. The rail-to-rail amplifier 90 functions as an analog output buffer, and the analog output buffer outputs a (clamp) voltage VCLMP approximately the same to the input reference voltage VREF, and the voltage VCLMP is applied to gates of a plurality of charge transfer transistors connected to a plurality of bit lines within a page buffer/a sensing circuit.

Figure 3:
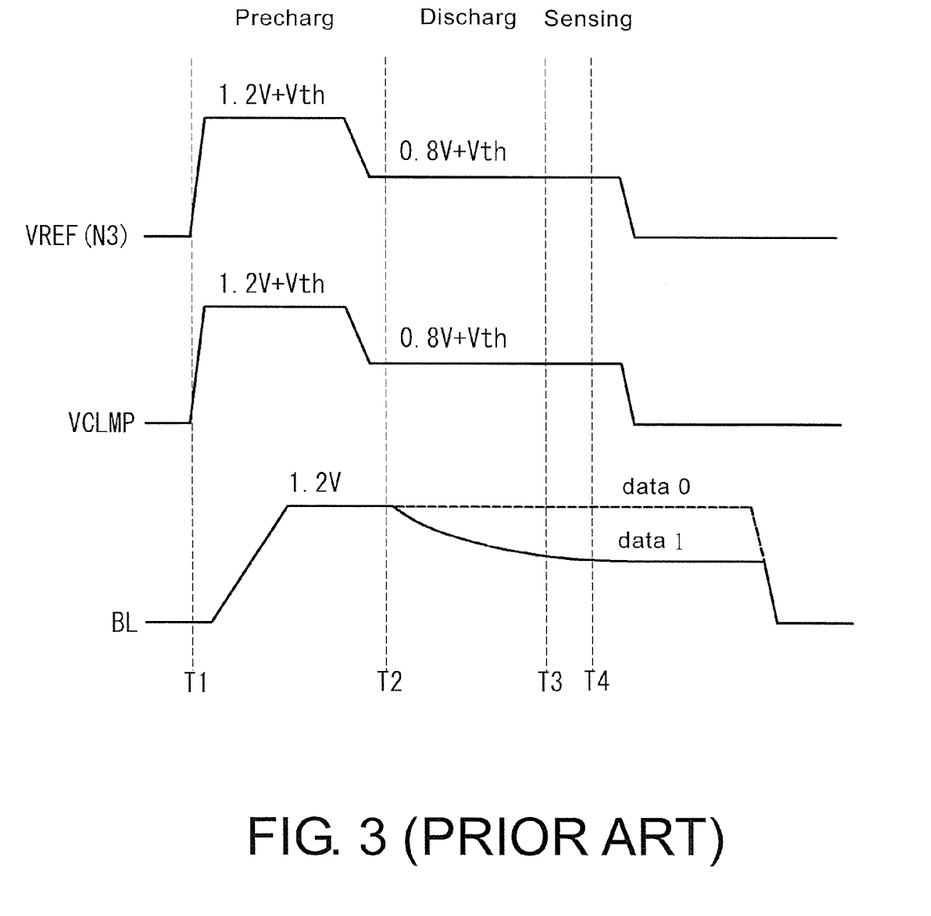
FIG. 3 is a voltage waveform diagram of a voltage VCLMP and a bit line.

Then, the operation of the clamp voltage generating circuit is described below. FIG. 3 is a voltage waveform diagram of the reference voltage VREF (the node N3), the voltage VCLMP and the bit line BL. At a time point T1, precharge of the bit line is started. Now, the voltage VCLMP is, for example, set to 1.2V+Vth, and the potential VDD is provided to a sensing node SNS. The charge transfer transistor TG is turned on by the voltage VCLMP, and the bit line BL is precharged to VCLMP-Vth, i.e. 1.2V by the sensing node SNS.

Then, when the precharge is ended at a time point T2, a voltage Vcg (for example, 0V) is applied to the selected word line, and a voltage Vpass is applied to non-selected word lines, and the selection transistor is turned on through selection gate lines SGD and SGS. When a memory unit MCn stores data "0", the memory unit MCn is turned off, and the precharge potential of the bit line BL almost has no change, and when the memory unit MCn stores data "1", the memory unit MCn is turned on, and the bit line BL starts to discharge.

Then, during a period of a time point T3 to a time point T4, the sensing point SNS is sensed. The voltage VCLMP is, for example, set to 0.8V+Vth. As described above, the voltage VCLMP is selected from a range 0.1V+Vth-1.6V+Vth with a step of 0.1V, and the voltage VCLMP can be obtained by setting the current (1 μA-16 μA) of the node CSUM of the current setting circuit 110. Therefore, when the data is "0", the charge transfer transistor TG is not turned on, and the potential of the sensing node SNS is still VDD, and when the data is "1", the charge transfer transistor TG is turned on, and the potential of the sensing node SNS is decreased.

If a voltage of the node N4 is equal to the voltage of the bit line BL, and the threshold voltage Vth of the transistor 80 is equal to the threshold voltage of the charge transfer transistor TG, a voltage between the source and the drain of the charge transfer transistor TG is correctly emulated, and the voltage VCLMP becomes a correct sensing level. However, the emulated voltage between the source and the drain of the transistor 80 is actually equal to the voltage between the node N3 and the node N4, which is unnecessarily complied with the voltage between the source and the drain of the charge transfer transistor TG, and is accordingly not complied with the correct sensing level.

Figure 4:
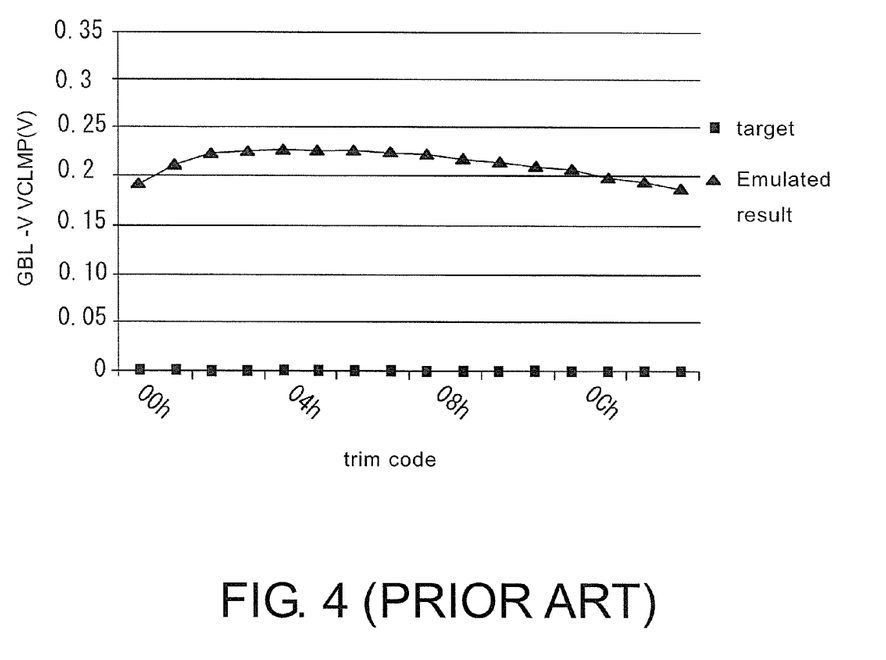
FIG. 4 illustrates a graph describing a deviation state of a clamp voltage output by the clamp voltage generating circuit of FIG. 2 when a voltage of a sensing node is detected.

FIG. 4 illustrates a graph emulating a global bit line (GBL) and the voltage VCLMP (the node N4), in which a horizontal axis represents cods, and a vertical axis represents a difference between the global bit line and the voltage VCLMP (the node N4). Moreover, the codes of the horizontal axis represent an emulation result of the clamp control signals CLMP1-CLMP4 of 4 bits. According to the chart, it is known that the difference voltage is deviated from an ideal target, i.e. 0V by about 0.2V-0.3V, and the difference voltage is uneven. Moreover, the voltage VCLMPMVT of the node N4 is used for measuring or evaluating a circuit characteristic.

Since a condition of the voltage between the source and the drain of the charge transfer transistor TG that determines the sensing level at the page buffer side is inconsistent with a condition of the voltage between the source and the drain of the emulate transistor 80 emulating the charge transfer transistor TG within the clamp voltage generating circuit at the peripheral circuit region side, the finally generated voltage VCLMP is deviated, and the voltage itself is probably uneven. If the voltage VCLMP that determines the sensing level is uneven, it may directly lead to uneven of the threshold voltage Vth of the memory unit, and adversely affect the threshold distribution of the memory unit.

SUMMARY

The invention is directed to a semiconductor memory apparatus, which has a voltage generating circuit, and the voltage generating circuit generates a correct clamp voltage.

The invention provides a semiconductor memory apparatus including a clamp voltage generating circuit. The clamp voltage generating circuit provides a clamp voltage to a charge transfer transistor, and the charge transfer transistor is coupled to a sensing node of a bit line. The clamp voltage generating circuit includes a transistor, which has a drain coupled to a first potential, a source coupled to a node, and a gate coupled to the clamp voltage; a current setting element, which is connected between the node and a second potential, and sets a current flowing from the node to the second potential; and a constant voltage output element, which inputs a voltage fed back from the node and a reference voltage, and controls an output of the clamp voltage in a manner that the feedback voltage is consistent with the reference voltage.

In an embodiment of the invention, the current setting element sets a drain current of the transistor. Preferably, the current setting element includes a plurality of current setting transistors connected in parallel, and current sources respectively coupled to the current setting transistors in series, where the current setting element sets the current by turning on the current setting transistors selected from the current setting transistors. Moreover, in another embodiment, the flash memory apparatus pre-stores duplication data that duplicates the current of the bit line, and the memory setting element sets the current according to the duplication data, where the duplication data is stored in a fuse register of each semiconductor chip. Moreover, the current setting element selects the current setting transistor to be turned on according to the duplication data. In the aforementioned embodiment, during a fixed period that the current setting element starts to precharge the bit line through the charge transfer transistor, a larger drain current is set, and after the fixed period, a current emulating the drain current of the charge transfer transistor is set. The larger drain current is preferably pre-stored in the memory. Moreover, the first potential is equal to the potential provided to the sensing node, and the drain current of the transistor is equal to the drain current of the charge transfer transistor. The constant voltage output element includes a regulator, where a non-inverted input terminal of the regulator inputs the reference voltage, and an inverted input terminal thereof inputs a feedback voltage, and the regulator outputs the clamp voltage. Moreover, the constant voltage output element includes a current mirror circuit that generates the reference voltage according to the selected current value. The current mirror circuit is coupled to a third potential greater than the first potential.

EFFECT OF THE INVENTION

According to the invention, the current setting element is used to duplicate the current of the bit line, so that a condition of the emulate transistor is similar to a condition of the charge transfer transistor. In this way, the clamp voltage with less unevenness is accurately provided to the charge transfer transistor.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Embodiments of the invention are described in detail below with reference of figures. Moreover, it should be noticed that in the figures, some parts are emphasized for easy understanding and are not necessarily drawn to scale.

(Embodiments)

Figure 5:
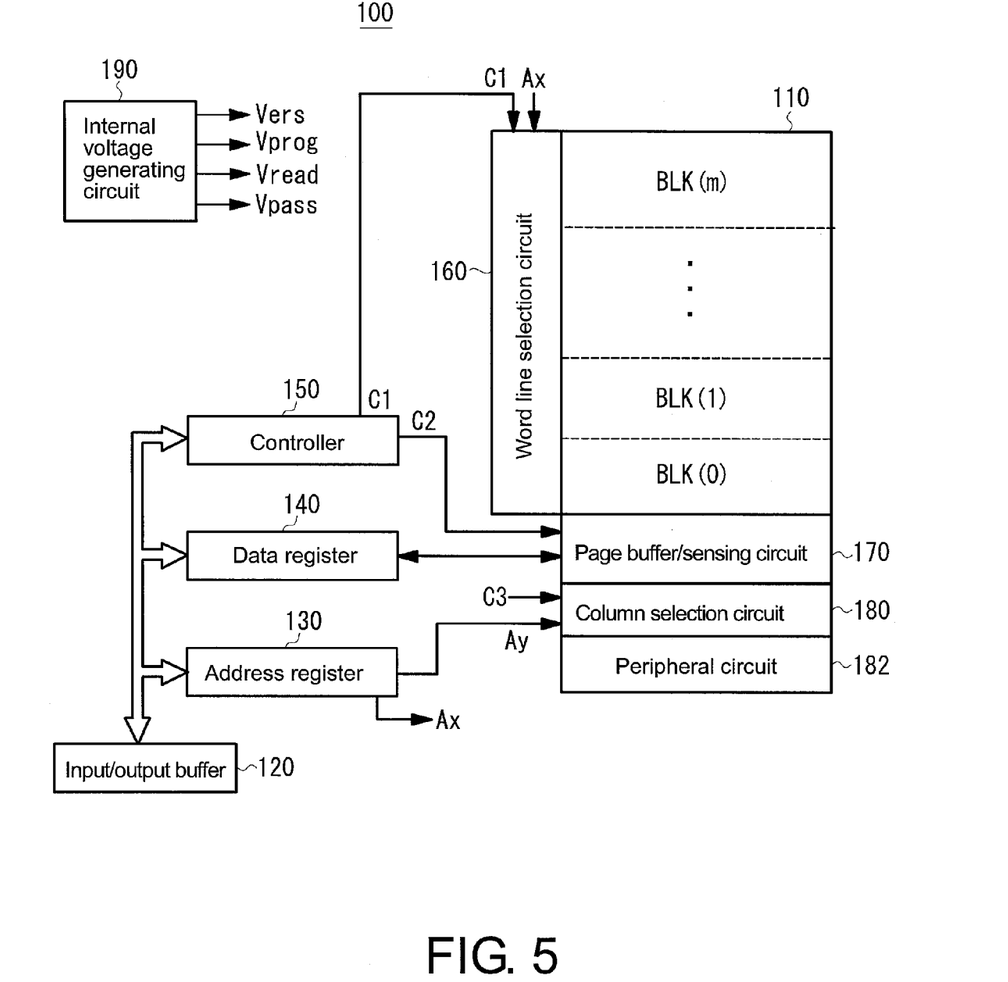
FIG. 5 is a block diagram of a structure of a flash memory according to an embodiment of the invention.

FIG. 5 is a block diagram of a structure of a flash memory according to an embodiment of the invention. However, the structure of the flash memory is only an example, and the invention is not limited thereto.

The flash memory of the present embodiment includes a memory array 110 formed by a plurality of memory units arranged in rows and columns; an input/output buffer 120 connected to an external input/output terminal I/O to input/output data; an address register 130, which receives address data from the input/output buffer 120; a data register 140, which stores the input/output data; a controller 150, which provides control signals C1, C2, C3, etc., where the control signals C1, C2 and C3 are used to control each part based on command data from the input/output buffer 120 and an external control signal (a chip enabling signal or an address latch enabling signal, etc., not shown); a word line selection circuit 160, which decodes row address data Ax from the address register 130, and performs block selection and word line selection, etc. according to a decoded result; a page buffer/sensing circuit 170, which keeps data read from the page selected by the word line selection circuit 160, or keeps data to be written to the selected page; a column selection circuit 180, which decodes column address data Ay from the address register 130, and selects column data in the page buffer 170 according to the decoded result; a peripheral circuit 182, which includes a clamp voltage generating circuit, etc.; and an internal voltage generating circuit 190, which generates voltages required for data reading, programming and erasing, etc. (a program voltage Vprog, a pass voltage Vpass, a read pass voltage Vread, and an erase voltage Vers, etc.).

The memory array 110 has a plurality of memory blocks BLK(0), BLK(1), . . . , BLK(m) arranged along a column direction. The page buffer/sensing circuit 170 is disposed at one end of the above memory blocks. However, the page buffer/sensing circuit 170 can also be disposed at another end or both ends of the memory hocks.

Figure 6:
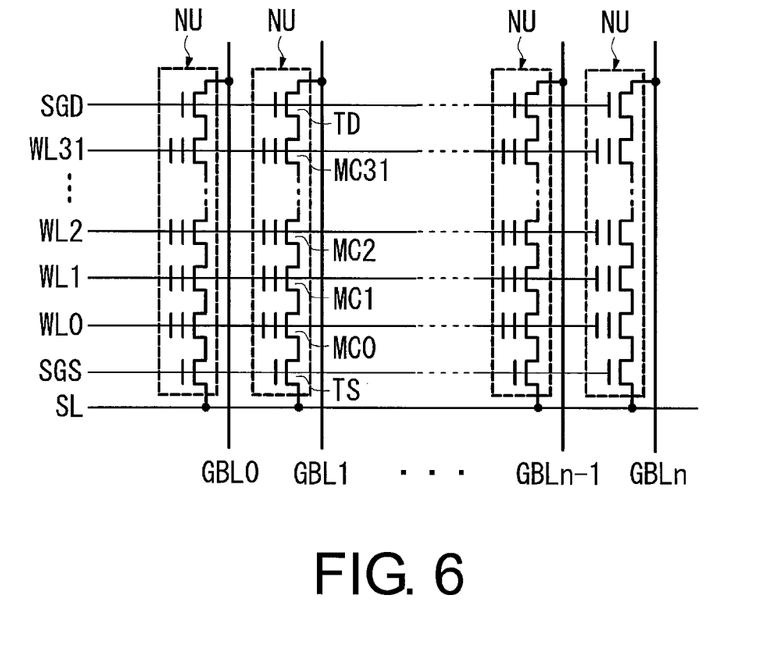
FIG. 6 is a circuit diagram illustrating a structure of NAND strings according to an embodiment of the invention.

As shown FIG. 6, one memory block includes a plurality of NAND string units NU formed by connecting a plurality of memory units in series, and in one memory block, (n+1) string units NU are arranged along the row direction. The string unit NU includes a plurality of memory units MCi (i=0, 1, . . . , 31) connected in series, a selection transistor TD connected to a drain of the memory unit MC31 located at one end, and a selection transistor TS connected to a source of the memory unit MC0 located at another end, where a drain of the selection transistor TD is connected to a corresponding bit line GBL, and a source of the selection transistor TS is connected to a common source line SL.

A control gate of the memory unit MCi is connected to a word line WLi, and gates of the selection transistors TD and TS are connected to selection gate lines SGD and SGS parallel to the word lines WL. When the word line selection circuit 160 selects the memory block according to the row address Ax, the word line selection circuit 160 selectively drives the selection transistors TD and TS through the selection gate lines SGD and SGS of the memory block.

The memory unit typically has an MOS structure, and the MOS structure includes source/drain serving as N-type diffusion regions and formed in a P-well; a tunnel oxide film formed on a channel between the source and the drain; a floating gate (charge trapping layer) formed on the tunnel oxide film; and a control gate formed on the floating gate through a dielectric film. When no charges are trapped in the floating gate, i.e., data "1" being written therein, the threshold value has a negative state, and the memory unit is in normal on. When charges are trapped in the floating gate, i.e. data "0" being written therein, the threshold value is shifted to a positive state, and the memory unit is in normal off.

Figure 7:
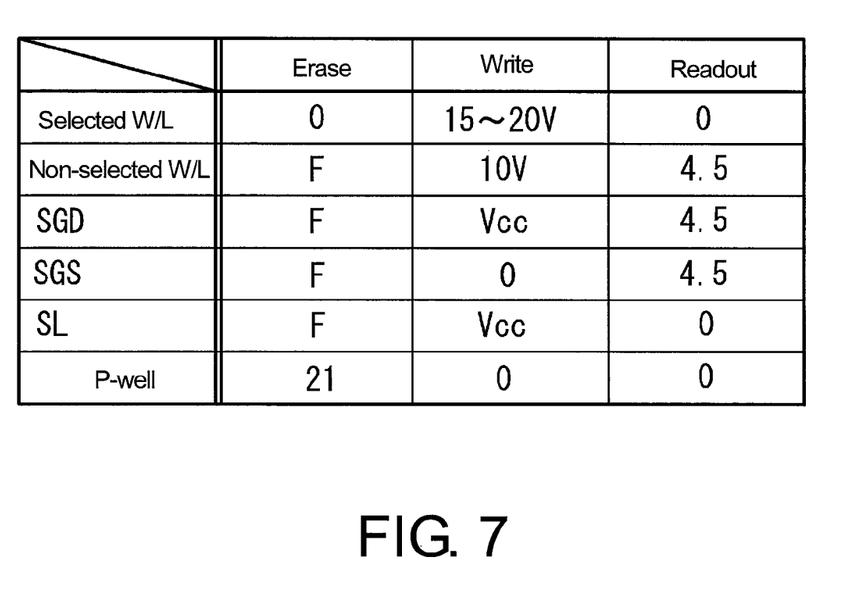
FIG. 7 is a chart illustrating voltages applied to various parts of the flash memory of the present embodiment.

FIG. 7 is a chart illustrating bias voltages applied in various operations of the flash memory. In a read operation, a certain positive voltage is applied to the bit line; a certain voltage (for example, 0V) is applied to the selected word line; the pass voltage Vpass (for example, 4.5V) is applied to the non-selected word lines; a positive voltage (for example, 4.5V) is applied to the selection gate lines SGD and SGS to turn on the bit line selection transistor TD and the source line section transistor TS; and 0V is applied to the common source line. In a program (write) operation, a program voltage Vprog of high voltage (15V-20V) is applied to the selected word line; a middle potential (for example, 10V) is applied to the non-selected word lines to turn on the bit line selection transistor TD and turn off the source line selection transistor TS; and a potential corresponding to the data "0" or "1" is provided to the bit line GBL. In the erase operation, 0V is applied to the selected bit line in the block, and a high voltage (for example, 20V) is applied to the P-well to draw electrons of the floating gate to a substrate. In this way, data is erased block by block.

Figure 8:
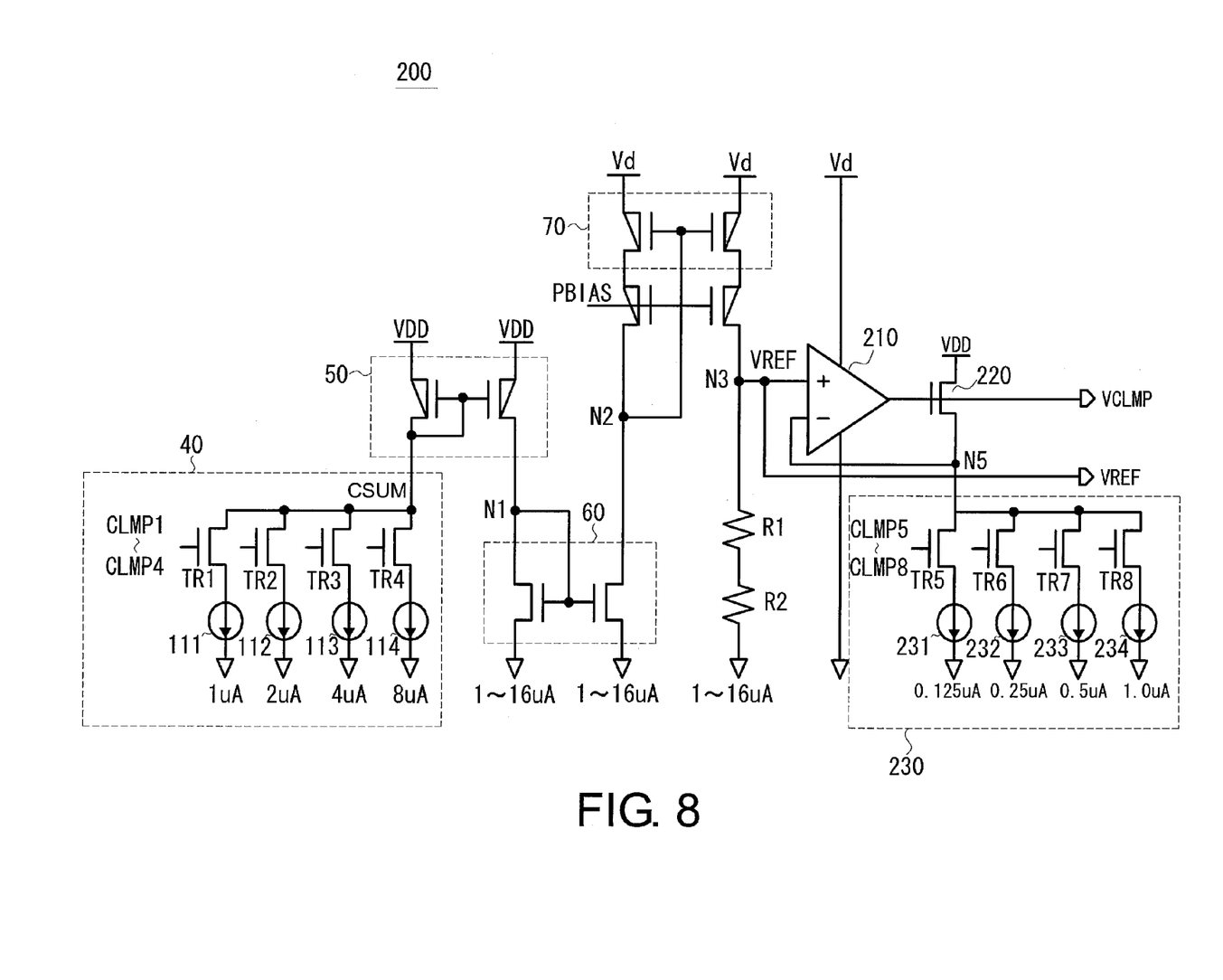
FIG. 8 illustrates a clamp voltage generating circuit according to an embodiment of the invention.

Then, FIG. 8 illustrates a clamp voltage generating circuit according to an embodiment of the invention. In the clamp voltage generating circuit 200 of the present embodiment, the same numerals are used to denote structures the same with that of the clamp voltage generating circuit 10A of FIG. 2.

The clamp voltage generating circuit 200 of the present embodiment is formed in the peripheral circuit 182 of the flash memory 100, and (clamp) voltage VCLMP generated by the clamp voltage generating circuit is supplied to the gates of the charge transfer transistors TG respectively connected to the (n+1) bit lines in the page buffer/sensing circuit 170.

In the clamp voltage generating circuit 200 of the present embodiment, the emulate transistor 80 of the clamp voltage generating circuit 10A of FIG. 2 is omitted, in stead, an emulate transistor 220 is disposed at an output terminal of a constant voltage output circuit 210. Preferably, the constant voltage output circuit 210 is composed of a regulator for outputting a constant voltage, where the reference voltage VREF of the node N3 is input to a non-inverted input terminal of the regulator 210, and a voltage at the source of the emulate transistor 220, i.e., the voltage at the node N5 is fed back to an inverted input terminal of the regulator 210. The regulator 210 is controlled by the feedback thereof to output the voltage VCLMP of VREF+Vth.

The NMOS emulate transistor 220 is connected between the power supply VDD and the node N5, i.e., a drain of the emulate transistor 220 is connected to the power supply VDD, a source thereof is connected to the node N5, and the output voltage VCLMP of the regulator 210 is supplied to the gate of the emulate transistor 220. When the emulate transistor 220 is turned on, the node N5 is charged, and such situation is fed back to the regulator 210. The regulator 210 controls the voltage VCLMP in a manner that the voltage of the node N5 is equal to the reference voltage VREF. The voltage of the node N5 is equal to VREF, so that the voltage VCLMP is fed back as VREF+Vth.

A second current setting circuit 230 is connected in series with the emulate transistor 220. The second current setting circuit 230 has a structure similar to that of the current setting circuit 40, though the second current setting circuit 230 may set a more subtle current value compared to that of the current setting circuit 40. The second current setting circuit 230 includes a plurality of NMOS transistors connected in parallel (for example, four transistors TR5-TR8), and four current sources 231-234 respectively connected to each of the transistors in series. Clamp control signals CLMP5-CLMP8 are respectively input to gates of the transistors TR5-TR8 to respectively turn on/turn off the transistors TR5-TR8. The constant current sources 231-234, for example, respectively provide constant currents of 0.125 pA, 0.25 pA, 0.5 μA and 1.0 μA. Based on 16 combinations of the clamp control signals CLMP4-CLMP8 of 4 bits, the currents from 0.125 μA to 2 pA with a step of 0.125 μA can be set.

The second current setting circuit 230 may duplicate the current of the bit line BL in the page buffer/sensing circuit during the read operation. In an exemplary embodiment, in order to prevent unevenness of each semiconductor wafer, a fuse register or a fuse read only memory (ROM), etc. is prepared for each wafer, where the fuse register or the fuse ROM is used for storing binary data of the clamp control signals CLMP5-CLMP8 to serve as the duplication data. For example, in a semiconductor wafer stage, a current value of a discharged bit line of the selected wafer or a test device is tested, and a fuse is modified according to the test result, and the duplication data is stored in the fuse register of each wafer. Moreover, codes of the clamp control signals CLMP1-CLMP4 of the first current setting circuit 40 can also be stored in the fuse register, etc. In addition, when the controller 150 performs the read operation, the clamp control signals CLMP1-CLMP4 or the clamp controls signals CLMP5-CLMP8 are read from the fuse register to set the current values of the first current setting circuit 40 and the second current setting circuit 230. Moreover, in other embodiments, the binary data of the clamp control signals CLMP5-CLMP8 can be stored in terms of bock other than wafer, and in the read operation, the clamp control signals CLMP5-CLMP8 of the block corresponding to the selected page are read to set the current value of the second current generating circuit 230. In an exemplary embodiment, the reference voltage VREF (the node N3) input to the non-inverted input terminal of the constant output circuit 210 can be output to external or tested to set the clamp control signals CLMP5-CLMP8.

Figure 9:
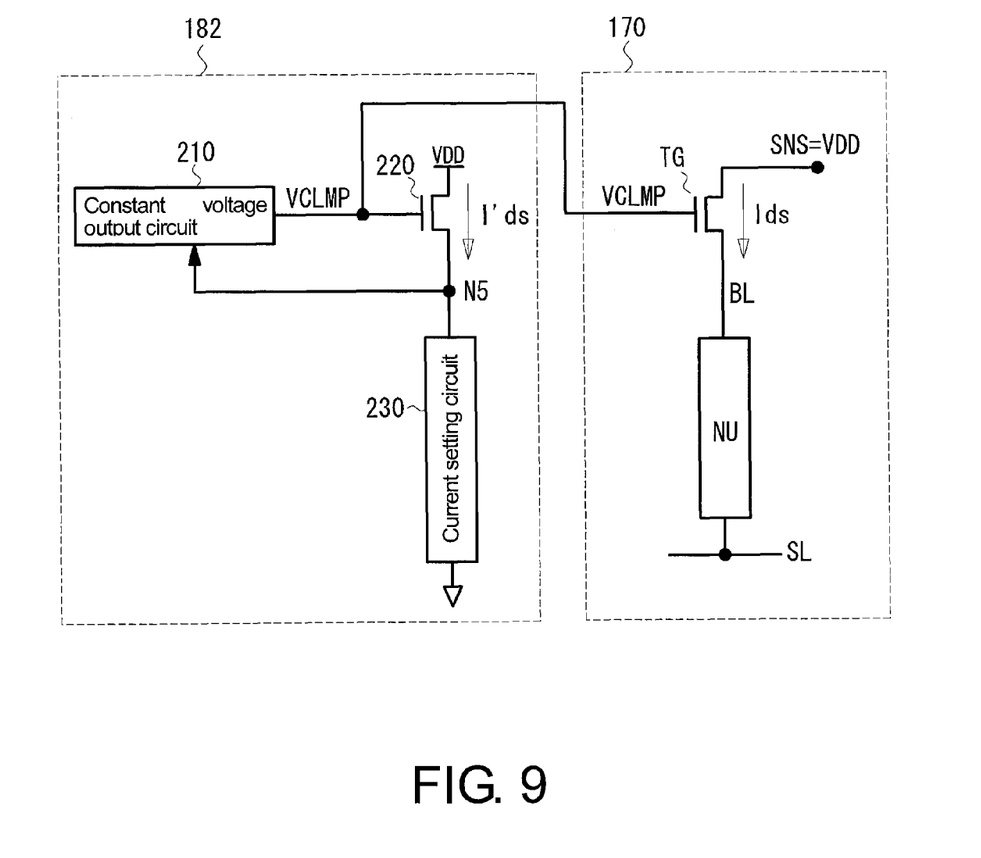
FIG. 9 is a diagram illustrating an operation of a clamp voltage generating circuit according to an embodiment of the invention.

FIG. 9 is a diagram illustrating an operation of the clamp voltage generating circuit of the embodiment. The regulator 210, i.e., the constant voltage output circuit 210 outputs the voltage VCLMP of VREF+Vth according to the feedback of the node N5. The voltage VCLMP is supplied to the gate of the emulate transistor 220, and is accordingly supplied to the gate of each of the charge transfer transistors TG connected to each of the bit lines BL in the page buffer/sensing circuit 170. The second current generating circuit 230 adopts a structure capable of adjusting a drain current I'ds of the emulate transistor 220 into a drain current Ids of the charge transfer transistor TG. In this way, a condition of the voltage between the source and the drain of the charge transfer transistor TG is very close to a condition of the voltage between the source and the drain of the emulate transistor 220. Therefore, deviation of the generated voltage VCLMP from the target voltage is suppressed. Accordingly, through the clamp control signals CLMP5-CLMP8 of the second current generating circuit 230, the drain current of the emulate transistor 220 is consistent with the drain current of the charge transfer transistor, so as to suppress unevenness of the voltage VCLMP.

In an exemplary embodiment of the invention, in the clamp voltage generating circuit 200, under control of the controller 150, the current I'ds flowing through the emulate transistor 220 is variable in the read operation. In this way, when the precharge is started, a precharging time of the bit line BL overdriven by a larger drain current Imax is shortened. The second current setting circuit 230, for example, sets the drain current Imax (Imax=I'ds×k, where k is any coefficient) according to the clamp control signals CLMP5-CLMP8 read from the fuse register. Alternatively, the clamp control signals CLMP5-CLMP8 of the drain current Imax can be stored in the fuse register.

Figure 10:
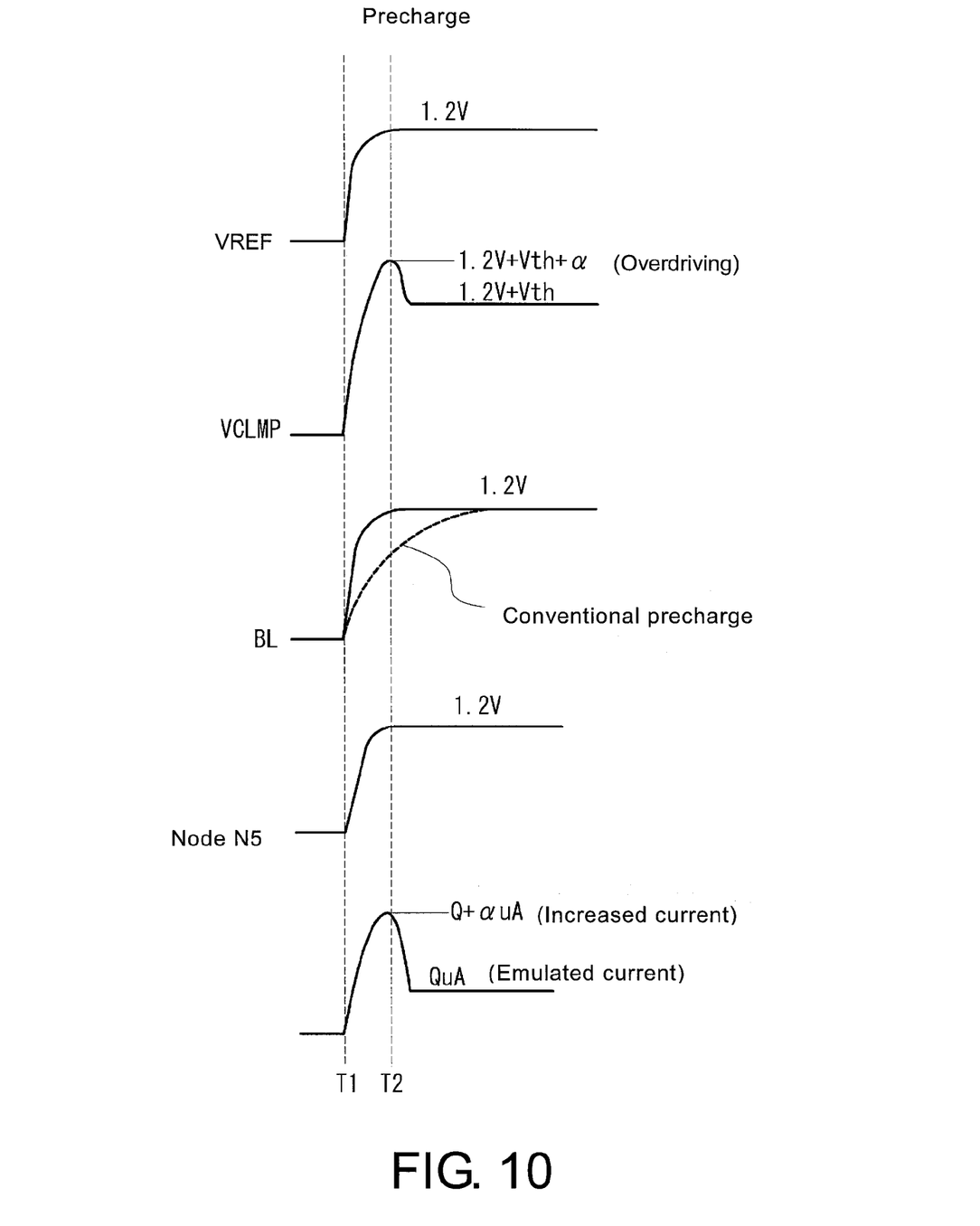
FIG. 10 is a waveform diagram of a clamp voltage generating circuit according to an embodiment of the invention.

FIG. 10 is a diagram illustrating voltage waveforms obtained when the precharge is started. At a time point T1, the precharge is started, and at a time point T2, the voltages respectively reach a peak through the overdriven drain current. The reference voltage VREF rises from the time point T1 to the time point T2, and as a result, the voltage VCLMP is overdriven to 1.2V+Vth+α at the time point T2. Based on the overdriving, at the time point T2 or at a moment after the time point T2, each of the bit lines BL is charged to the precharge voltage (1.2V). A curved line shown by dot lines represents a conventional precharging time without the aforementioned overdriving. The second current setting circuit 230 implements control in a manner of enabling an increased current Q+αμA, which reaches the peak at the time point T2, and then implements the control in a manner of enabling an emulate current Q μA.

By generating the correct precharge voltage of the bit line according to the present embodiment, unevenness of the discharging time of the bit lines simply becomes inherent unevenness of the memory units (according to the threshold value Vth of the memory unit). Therefore, the sensing time of the sense amplifier can be correctly set to shorten a read time.

In the aforementioned embodiments, the example of using the clamp voltage generating circuit in the read operation is provided, though in other embodiments, the clamp voltage generating circuit can also be used in calibration. Moreover, in the aforementioned embodiments, the first current setting circuit 40 and the second current setting circuit 230 include the transistors of 4 bits, though in other embodiments, the transistors may include a plurality of bits. In addition, in the aforementioned embodiments, reading of the memory unit storing the binary data is described, though the invention is also adapted to the flash memory having the memory units capable of storing Multi-value data. Now, the clamp voltage generating circuit generates the voltage VCLMP used for sensing the Multi-vale data. Moreover, in the aforementioned embodiments, the clamp voltage generating circuit of the flash memory is described, though the clamp voltage generating circuit can also be used in other semiconductor memories.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A semiconductor memory apparatus, comprising a clamp voltage generating circuit, the clamp voltage generating circuit providing a clamp voltage to a charge transfer transistor coupled to a sensing node of a bit line, wherein the clamp voltage generating circuit comprises:
    a emulate transistor, having a drain coupled to a first potential, a source coupled to a node, and a gate coupled directly to the clamp voltage;
    a current setting element, connected between the node and a second potential, and setting a current flowing from the node to the second potential; and
    a constant voltage output element, inputting a voltage fed back from the node and a reference voltage, and controlling an output of the clamp voltage in a manner that the feedback voltage is consistent with the reference voltage.

2. The semiconductor memory apparatus as claimed in claim 1, wherein
    the current setting element sets a drain current of the emulate transistor.

3. The semiconductor memory apparatus as claimed in claim 1, wherein
    the current setting element comprises a plurality of current setting transistors connected in parallel and current sources respectively connected in series to the current setting transistors, and the current setting element sets a current by turning on the current setting transistor selected from the current setting transistors.

4. The semiconductor memory apparatus as claimed in claim 1, wherein
    a flash memory pre-stores a duplication data that is used to duplicate a current of the bit line, and the current setting element sets the current according to the duplication data.

5. The semiconductor memory apparatus as claimed in claim 1, wherein
    the first potential is equal to a potential provided to the sensing node, and a drain current of the emulate transistor is equal to a drain current of the charge transfer transistor.

6. The semiconductor memory apparatus as claimed in claim 1, wherein
    the constant voltage output element comprises a regulator, wherein a non-inverted input terminal of the regulator inputs the reference voltage, and an inverted input terminal thereof inputs the feedback voltage, and the regulator outputs the clamp voltage.

7. The semiconductor memory apparatus as claimed in claim 1, wherein
    the constant voltage output element comprises a current mirror circuit that generates the reference voltage according to a selected current value, and the current mirror circuit is coupled to a third potential greater than the first potential.

8. The semiconductor memory apparatus as claimed in claim 2, wherein
    the current setting element comprises a plurality of current setting transistors connected in parallel and current sources respectively connected in series to the current setting transistors, and the current setting element sets a current by turning on the current setting transistor selected from the current setting transistors.

9. The semiconductor memory apparatus as claimed in claim 2, wherein
    a flash memory pre-stores a duplication data that is used to duplicate a current of the bit line, and the current setting element sets the current according to the duplication data.

10. The semiconductor memory apparatus as claimed in claim 3, wherein the current setting element selects the current setting transistor to be turned on according to the duplication data.

11. The semiconductor memory apparatus as claimed in claim 4, wherein the duplication data is stored in a fuse register of a semiconductor chip.

12. The semiconductor memory apparatus as claimed in claim 8, wherein the current setting element selects the current setting transistor to be turned on according to the duplication data.

13. The semiconductor memory apparatus as claimed in claim 9, wherein the duplication data is stored in a fuse register of a semiconductor chip.

14. A semiconductor memory apparatus, comprising:

a clamp voltage generating circuit, the clamp voltage generating circuit providing a clamp voltage to a change transfer transistor coupled to a sensing node of a bit line, wherein the clamp voltage generating circuit comprises:

a transistor, having a drain coupled to a first potential, a source coupled to a node, and a gate coupled to the clamp voltage;

a current setting element, connected between the node and a second potential, and setting a current flowing from the node to the second potential; and a constant voltage output element, inputting a voltage fed back from the node and a reference voltage, and controlling an output of the clamp voltage in a manner that the feedback voltage is consistent with the reference voltage, wherein during a fixed period that the current setting element starts to precharge the bit line through the charge transfer transistor, the current setting element sets a larger drain current, and sets a current after the fixed period is ended, wherein the current emulates the drain current of the charge transfer transistor.

15. The semiconductor memory apparatus as claimed in claim 14, wherein the larger drain current is pre-stored in a memory.

\* \* \* \* \*